(12) United States Patent
Hase

(10) Patent No.: US 7,236,239 B2
(45) Date of Patent: Jun. 26, 2007

(54) ILLUMINATION SYSTEM AND EXPOSURE APPARATUS

(75) Inventor: Tomoharu Hase, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 10/948,700

(22) Filed: Sep. 23, 2004

(65) Prior Publication Data

US 2005/0117137 A1 Jun. 2, 2005

(30) Foreign Application Priority Data

Sep. 25, 2003 (JP) ............................. 2003-333627

(51) Int. Cl.
*G01B 9/00* (2006.01)
*G03B 27/54* (2006.01)
*G02B 27/10* (2006.01)

(52) U.S. Cl. .................. 356/124; 359/624; 355/76

(58) Field of Classification Search ........ 356/121–124, 356/124.5, 125–127; 359/649, 618–619, 359/621–622, 626, 631; 355/53–55, 67, 355/71; 353/31, 38, 122
See application file for complete search history.

(56) References Cited

U.S. PATENT DOCUMENTS

| | | | | |
|---|---|---|---|---|
| 4,682,885 A * | 7/1987 | Torigoe | ........................ | 355/67 |
| 4,733,944 A * | 3/1988 | Fahlen et al. | ................ | 359/624 |
| 4,988,188 A * | 1/1991 | Ohta | ........................... | 353/122 |
| 5,626,409 A * | 5/1997 | Nakayama et al. | ........... | 353/31 |
| 5,731,577 A | 3/1998 | Tanitsu | | |
| 5,739,899 A | 4/1998 | Nishi et al. | | |
| 5,786,939 A * | 7/1998 | Watanabe | ................... | 359/621 |
| 5,798,824 A * | 8/1998 | Kudo | ........................... | 355/67 |
| 5,932,094 A * | 8/1999 | Binder et al. | ............... | 210/171 |
| 6,127,095 A * | 10/2000 | Kudo | ......................... | 430/311 |
| 6,259,512 B1 * | 7/2001 | Mizouchi | .................... | 355/67 |
| 6,285,855 B1 * | 9/2001 | Tsuji | ........................ | 359/618 |
| 6,333,777 B1 | 12/2001 | Sato | | |
| 6,560,044 B2 * | 5/2003 | Shinoda | ..................... | 359/800 |
| 6,563,567 B1 * | 5/2003 | Komatsuda et al. | .......... | 355/71 |
| 6,614,597 B2 * | 9/2003 | Mizouchi | .................... | 359/649 |
| 7,023,953 B2 * | 4/2006 | Komatsuda | .................. | 378/34 |
| 2002/0067550 A1 | 6/2002 | Mizouchi et al. | | |

FOREIGN PATENT DOCUMENTS

| | | |
|---|---|---|
| JP | 9-26554 | 1/1997 |
| JP | 11-87232 | 3/1999 |
| JP | 2002-50564 | 2/2002 |

* cited by examiner

*Primary Examiner*—Sang H. Nguyen
(74) *Attorney, Agent, or Firm*—Morgan & Finnegan LLP

(57) ABSTRACT

Disclosed is an illumination system for illuminating a surface to be illuminated, with light from a light source, the illumination system including a first optical integrator having a plurality of lens groups, for forming a plurality of first secondary light sources by use of light from the light source, a second optical integrator for forming a second secondary light source by use of light from the first secondary light sources, a first collecting optical system for superposing light from the first secondary light sources on a light entrance surface of the second optical integrator, a second collecting optical system for superposing light from the second secondary light source on the surface to be illuminated, and a driving mechanism for moving at least one of the plurality of lens groups translationally along a plane perpendicular to an optical axis, whereby the telecentricity of light illuminating the surface to be illuminated can be adjusted.

7 Claims, 7 Drawing Sheets

ILLUMINATION SYSTEM AND EXPOSURE APPARATUS

FIELD OF THE INVENTION AND RELATED ART

This invention relates generally to an illumination system, an exposure apparatus and a device manufacturing method using the same. More particularly, the invention concerns an illumination system suitably usable in an exposure apparatus for manufacture of devices such as semiconductor devices or liquid crystal display devices, for example.

Recent projection exposure apparatuses for manufacture of large-density semiconductor devices such as VLSI, for example, are strictly required to have high uniformness of illuminance distribution for circuit pattern printing as well as good telecentricity of light impinging on a wafer (substrate).

This is because, generally, semiconductor devices are produced through a plurality of lithographic processes. Thus, if the telecentricity of light incident on a wafer is degraded, image misregistration may occur when in a current lithographic process a circuit pattern is superposedly printed on the surface of a wafer having a surface step defined thereon through a preceding lithographic process and, in that occasion, high-accuracy semiconductor devices are no more obtainable.

The telecentricity of light incident on a wafer may be degraded by the following factors, for example.

(1) A geometry-optical deviation resulting from a manufacturing error of a projection system;
(2) A deviation of light quantity centroid resulting from non-uniformness of transmittance of a dielectric multilayered film of an optical element of a projection system;
(3) A geometry-optical deviation resulting from a movement error of a movable portion caused by a manufacturing error of an illumination system or caused when a value $\sigma$, as can be represented by the ratio between the numerical aperture of the illumination system and the numerical aperture of the projection system, is to be changed or when the illumination mode is to be changed between normal illumination and oblique illumination; and
(4) A deviation of light quantity centroid resulting from non-uniformness of transmittance of a dielectric multilayered film of an optical element of an illumination system.

These factors do not always attribute singly but, in some cases, act in any combination.

In order to correct distortion of telecentricity upon a surface to be illuminated, Japanese Laid-Open Patent Application, Publication No. 09-026554 (U.S. Pat. No. 5,739,899), for example, proposes a structure that two fly's eye lenses (amplitude division type optical integrators) are disposed in series along an optical path of an illumination system so that a light entrance surface of the rear fly's eye lens is Koehler-illuminated by light outgoing from the front fly's eye lens, and that the rear fly's eye lens is constituted by two groups (front and rear groups) wherein the rear group is made movable translationally relative to the front group along a plane perpendicular to the optical axis, whereby the direction of light outgoing from the rear fly's eye lens is changed to adjust the telecentricity of light upon an image plane.

Also, the aforementioned publication, Japanese Laid-Open Patent Application, Publication No. 09-026554, refers to a known example wherein a portion of an optical system downstream of a fly's eye lens is moved in a direction perpendicular to the optical axis or along the optical axis, thereby to adjust the telecentricity upon an image plane of a projection optical system.

Japanese Laid-Open Patent Application, Publication No. 2002-50564 (U.S. Published Patent Application, Publication No. 2002/067550) proposes another example of correcting distortion of telecentricity upon a surface to be illuminated, wherein an internal reflection type optical rod is used as a first optical integrator while an amplitude division type fly's eye is used as a second optical integrator, and wherein the optical rod (first optical integrator) is moved in a direction orthogonal to the optical axis to change the centroid position of the light quantity distribution and to thereby adjust the telecentricity upon the image plane.

However, with the adjusting method disclosed in Japanese Laid-Open Patent Application, Publication No. 09-026554, although the advancement direction of light outgoing from the rear fly's eye lens is changed by the shift of the rear group of the rear fly's eye lens, since in this structure the surface to be illuminated is to be Koehler illuminated by the rear fly's eye lens, it would result in lateral shift of the illumination region defined by the illumination light. This means that, to enable adjustment of the telecentricity, a range larger than the required illumination region must be illuminated by the illumination light. This directly leads to a decrease of illumination light utilization efficiency, and in turn it causes a decrease of throughput.

Similarly, also in the technique discussed as a known example in Japanese Laid-Open Patent Application, Publication No. 09-026554, there is a problem that, as a semiconductor manufacturing apparatus, a range larger than the required illumination region must be illuminated by the illumination light.

On the other hand, in the structure disclosed in Japanese Laid-Open Patent Application, Publication No. 2002-50564, although an optical rod is used as the first optical integrator, as a property of an internal reflection type optical rod the uniformness of illuminance distribution at its exit end is approximately proportional to the frequency of reflection (number of reflections) within the optical rod. The requirement for uniformness of illuminance on the surface to be illuminated is becoming much severe because of recent miniaturization of semiconductor chip. The frequency of reflection within the optical rod has to be increased for this reason, and thus the length of the optical rod is being prolonged. However, this causes a decrease of transmittance of illumination light through a glass material.

Particularly, in the case where ArF excimer laser or F2 laser is used as a light source of an exposure apparatus, the transmittance of illumination light would be decreased considerably by the optical rod, resulting in degradation of the throughput.

It is desirable therefore to provide an illumination system in which the telecentricity on an image plane can be adjusted without lowering the illumination light utilization efficiency.

SUMMARY OF THE INVENTION

It is an object of the present invention to provide an illumination system by which the telecentricity on an image plane can be adjusted without lowering the illumination light utilization efficiency.

In accordance with an aspect of the present invention, there is provided an illumination system for illuminating a surface to be illuminated, with light from a light source, said illumination system comprising: a first optical integrator having a plurality of lens groups, for forming a plurality of first secondary light sources by use of light from the light source; a second optical integrator for forming a second secondary light source by use of light from the first secondary light sources; a first collecting optical system for superposing light from the first secondary light sources on a light entrance surface of said second optical integrator; a second collecting optical system for superposing light from the second secondary light source on the surface to be illuminated; and a driving mechanism for moving at least one of the plurality of lens groups translationally along a plane perpendicular to an optical axis, to adjust telecentricity of light illuminating the surface to be illuminated.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
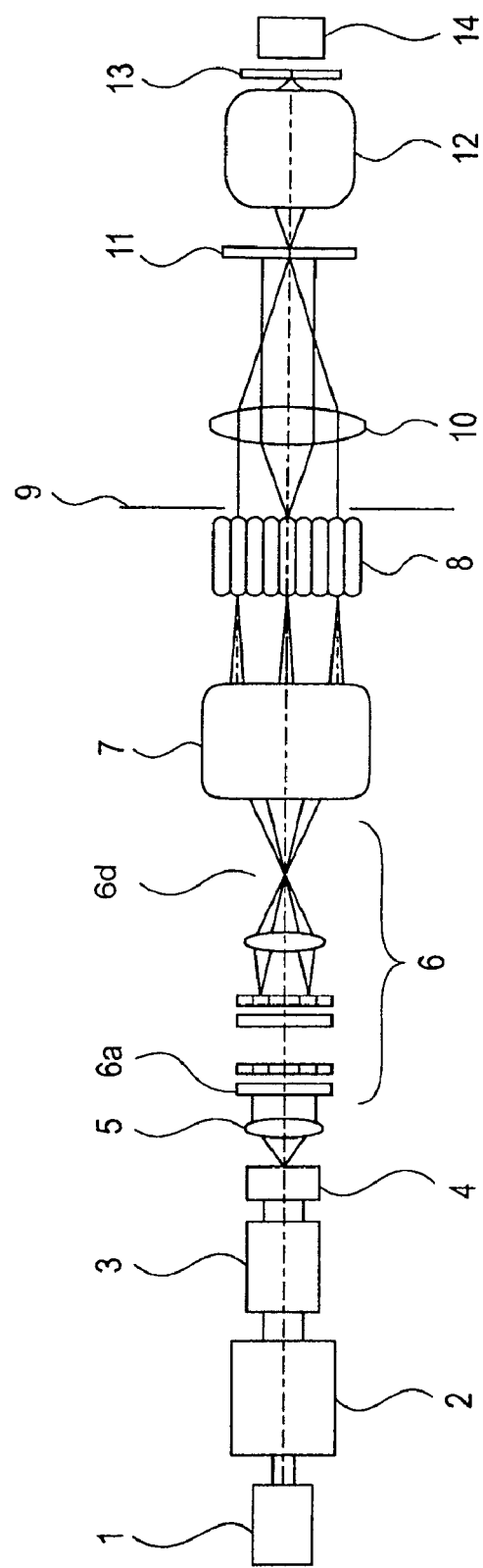
FIG. 1 is a schematic view of a structure of an exposure apparatus according to a first embodiment of the present invention.

FIG. 1 is a schematic view of a main portion of an exposure apparatus in which an illumination system according to a first embodiment of the present invention is incorporated as an illumination system for illuminating a reticle (mask). The exposure apparatus in this example is a step-and-repeat type or step-and-scan type projection exposure apparatus for manufacturing devices such as semiconductor chip (LSI or VLSI), CCD, magnetic sensor, liquid crystal device or the like.

Denoted in FIG. 1 at 1 is a laser light source which comprises ArF excimer laser, KrF excimer laser or F2 laser, for example. Denoted at 2 is an incoherency transforming optical system (coherency reducing means) for transforming coherent laser light from the light source 1 into incoherent light thereby to prevent generation of speckle due to interference fringe, upon a wafer 13 which is a substrate. Denoted at 3 is a beam shaping optical system for shaping light from the optical system 2 into a desired beam shape.

Denoted at 4 is an emission angle preserving optical element which as an optical function for maintaining a constant emission angle irrespective of shift of light incident thereon.

Figure 2:
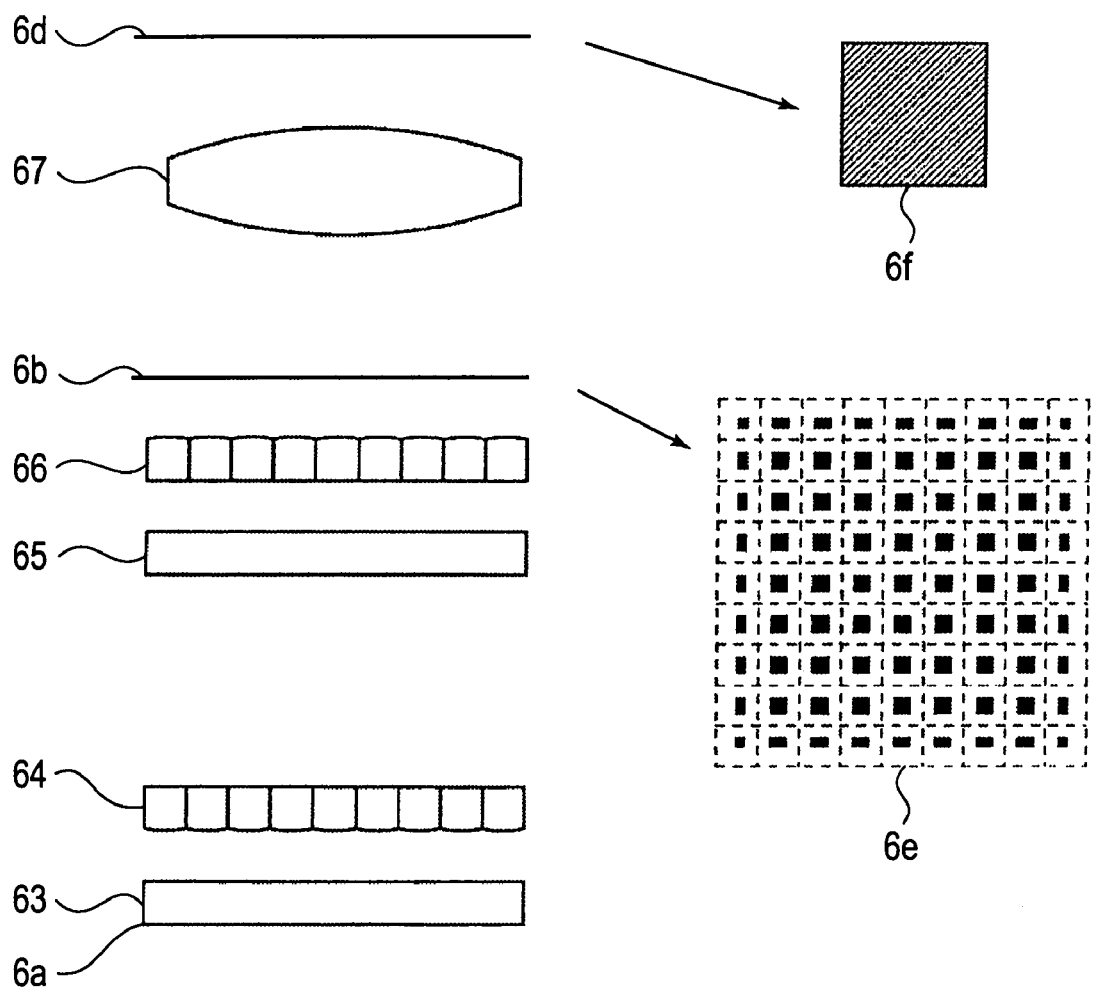
FIG. 2 a schematic view for explaining the structure of an optical integrator system.
Figure 3:
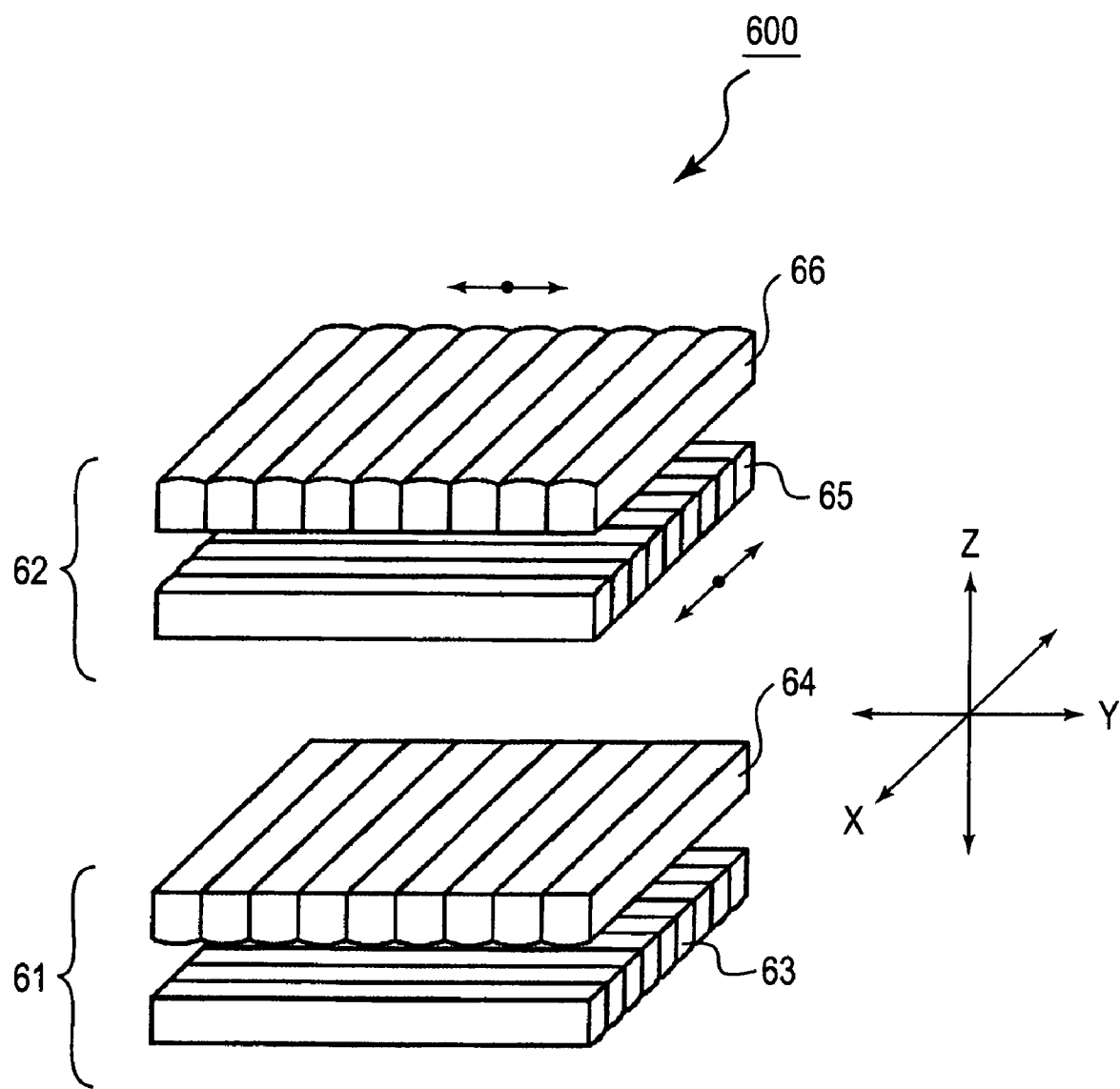
FIG. 3 is a schematic and perspective view of a first optical integrator.

Denoted at 5 is a collecting optical system for collecting light from the optical element 4 and for directing it to a light entrance surface 6a of an optical integrator system 6. A first optical integrator 600 of the optical integrator system comprises two groups, that is, a front group 61 (having cylindrical lens groups 63 and 64) and a rear group (having cylindrical lens groups 65 and 66). The cylindrical lens groups 63 and 65 have a refractive power in an X-Z plane, while the cylindrical lens groups 64 and 66 have a refractive power in a Y-Z plane. As shown in FIG. 2, these lens groups function to produce a large number of point light sources 6e as secondary light sources, upon a collection plane 6b. By means of a condenser 6c, light beams are superposed upon one another on a plane 6d (first plane), whereby uniform illuminance distribution 6f is produced.

The illumination range to be defined on the first plane 6d can be adjustably shifted by translationally moving either one of the front group 61 and the rear group 62 in X and Y directions. Alternatively, the lens groups 63-66 may be arranged as separate four lens groups and, for shifting the irradiation range in X direction, either one of the lens groups 63 and 65 may be adjustably moved in X direction while, for shifting the irradiation range in Y direction, either one of the lens groups 64 and 66 may be adjustably moved in Y direction.

By moving the lens group with use of a driving mechanism 20, the illumination range of light on the light exit surface 6d can be shifted in orthogonal directions. With this shift, through an imaging system 7, the centroid position of the light intensity distribution upon a light entrance surface 8a of a multiple-beam producing means 8 is shifted, such that the telecentricity of light (axial imaging light bundle) on the wafer 13 can be adjusted.

Denoted at 7 is a zoom optical system (imaging optical system) by which the light from the optical integrator system 6 can be projected onto the light entrance surface 8a of the multiple-beam producing means 8 at various magnifications. Here, the first plane 6d defined by this light mixing means 6 and the light entrance surface 8a of the multiple-beam producing means 8 are approximately in an optically conjugate relationship. The imaging optical system 7 and the condenser 67 when combined may be called a first collecting optical system.

The second optical integrator 8 is a fly's eye lens having a large number of element lenses, and it functions to produce secondary light sources (effective light sources) at its light exit surface 8b. Denoted at 9 is an aperture stop having a function for determining the size and shape of the secondary light sources. By changing the size (a value) and/or shape of the opening of the aperture stop 9, the illumination mode can be changed as described hereinbefore. Here, as a matter of course, the second integrator may be constituted by four cylindrical lens groups, like the first optical integrator.

Denoted at 10 is a condenser (second collecting optical system) which includes a condenser lens, for example. It functions to superpose light beams from the element lenses of the multiple-beam producing means 8 one upon another, on the reticle 11, whereby the reticle 11 can be Koehler illuminated uniformly.

Denoted at 12 is a projection system which comprises a system being telecentric on the light exit side, and it projects a pattern formed on the reticle 11 surface onto the wafer 13 surface in a reduced scale. Denoted at 14 is a detector for detecting the centroid of the light quantity distribution of incident light. On the basis of the result of detection, the telecentricity of light incident on the wafer 13 can be detected. The telecentricity is discussed in detail in Japanese Laid-Open Patent Application, Publication No. 11-087232 (U.S. Pat. No. 6,333,777), so description thereof will be omitted here.

Figure 4A:
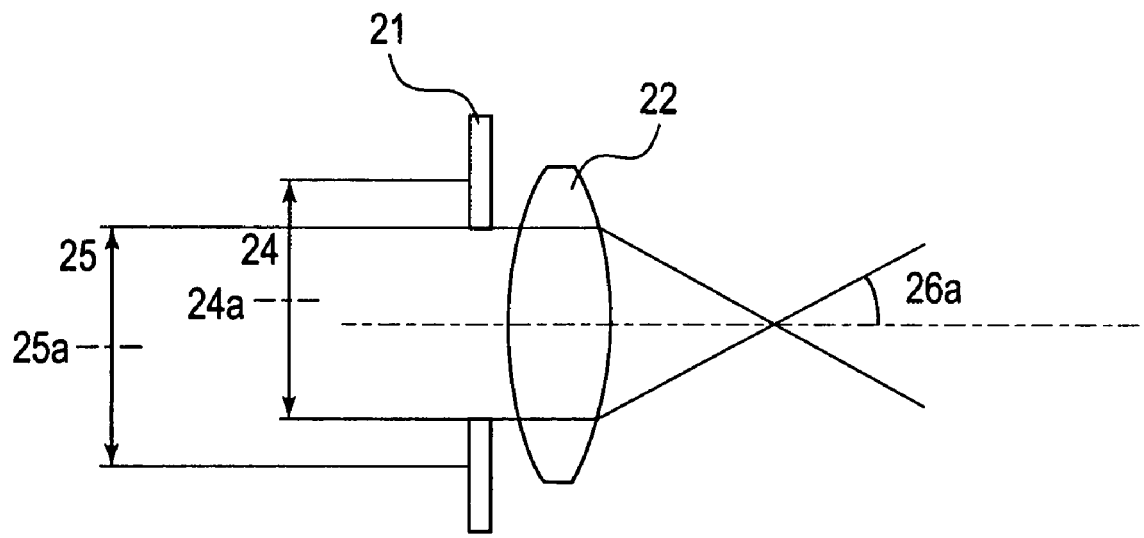
FIGS. 4A and 4B are illustrations for explaining an emission angle preserving optical element.

The emission angle preserving optical element 4 comprises an aperture (stop) 21 and a lens system 22, such as shown in FIG. 4A, for example. Even if, for example, the incident light shifts minutely from the light beam 24 position (beam center is at 24a) to the light beam 25 position (beam center is at 25a) in a direction orthogonal to the optical axis, the emission angle 26a of light outgoing from the optical element 4 can be held constant.

Figure 4B:
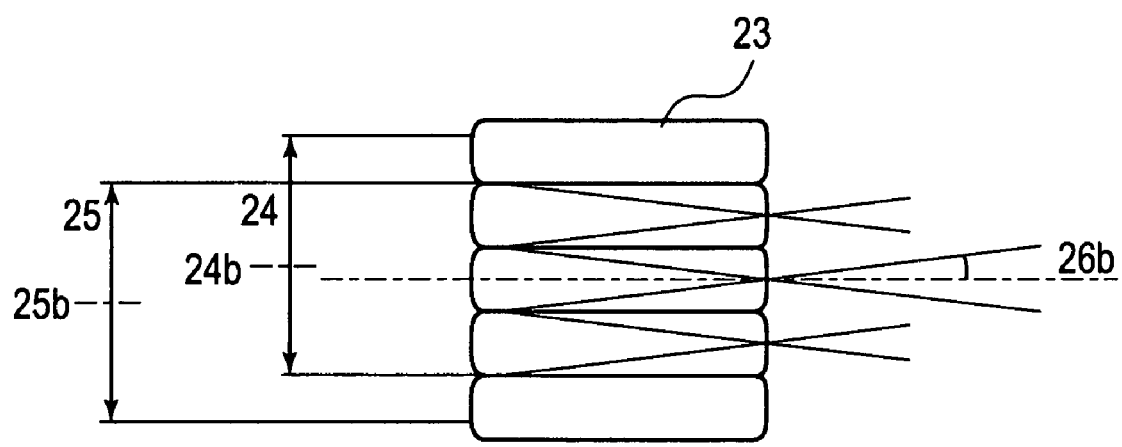

Alternatively, as shown in FIG. 4B, for example, the emission angle preserving optical element 4 may be constituted by a fly's eye lens having a plurality of bundled bar-like lenses 23. In that occasion, the emission angle 26b of light can be determined by the shape of the fly's eye lens 23. Also in this example, even if the incident light minutely shifts and it is incident as like light beam 24 (having a beam center at 24b) or light beam 25 (having a beam center at 25b), the emission angle 26b of light outgoing from the element 4 can be held constant.

Figure 5A:
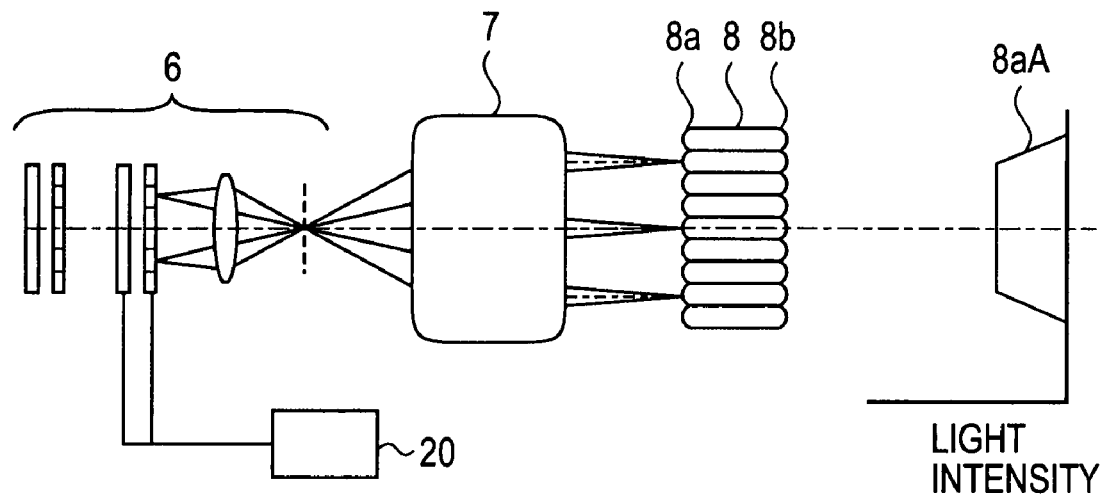
FIGS. 5A and 5B are illustrations for explaining an operation for telecentricity adjustment in the first embodiment of the present invention.
Figure 5B:
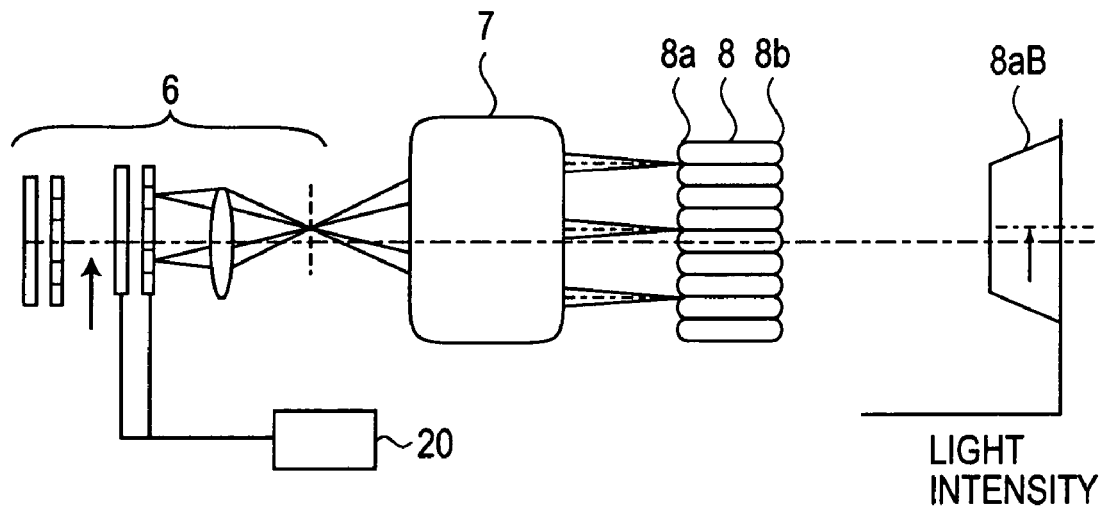

FIGS. 5A and 5B are illustrations for explaining the operation for telecentricity adjustment.

FIG. 5A shows the reference state in which the central positions of the optical integrator system 6, the zoom optical system (imaging system) 7 and the second optical integrator 8 are all registered on the optical axis. The light intensity distribution on the light entrance surface 8a of the fly's eye lens in this state is illustrated in the drawing at 8aA. It is seen that the light intensity distribution 8aA provides an illuminance distribution being symmetrical with respect to the optical axis.

FIG. 5B shows what occurs by the telecentricity adjustment operation. More specifically, one lens group (62) of the lens groups of the optical integrator is moved from its reference state position in a direction of an arrow in the drawing. By moving the lens group of the optical integrator, the light intensity distribution on the light entrance surface 8a of the fly's eye lens is changed to one shown at 8aB in the drawing and, as a result of it, the centroid position of the effective light source produced at the light exit surface 8b of the second optical integrator 8 is shifted. Thus, the telecentricity upon the wafer 13 can be adjusted thereby. Such adjustment may be performed at any time, e.g., during manufacture of or at shipment of the projection exposure apparatus, when the illumination mode is changed during the operation of the projection exposure apparatus, or when optical parts are degraded with elapse of time, in summary, if the telecentricity is degraded or seems to be degraded.

As regards the telecentricity adjustment described above, the detection result from the detector 14 may be fed back to the driving mechanism 7 so that automatic control is carried out to maintain a desired good condition. Alternatively, an operator may perform the adjustment on the basis of the detection result of the detector.

As a further alternative, in relation to each illumination mode, an optimum adjustment position may be stored into a memory (not shown) such that, when the illumination mode is to be changed to another, the optical integrator may be driven in accordance with the positional information stored in the memory.

Further, a term is specified beforehand and, after that term is elapsed and at a timing that does not interfere with the exposure operation for substrates, operations for determining and memorizing the optimum adjustment position in relation to each illumination mode may be performed.

In accordance with this embodiment of the present invention as described above, the illumination range does not shift when a deviation of telecentricity on the surface to be illuminated is corrected appropriately. Therefore, it is unnecessary to set a wide irradiation range in preparation for the adjustment, and thus unwanted degradation of efficiency of the illumination light can be avoided. Furthermore, the first optical integrator comprises a front group and a rear group, wherein each group includes an optical integrator having a cylindrical lens group with a plurality of cylindrical surfaces. With this arrangement, the optical path length inside the glass material can be shortened as compared with a case where an internal reflection type optical rod is used. As a result, degradation of illuminance can be suppressed. From these features, it is seen that this embodiment is particularly suitably usable to cases where ArF excimer laser or F2 laser, for example, is used as a light source.

Embodiment 2

Next, referring to FIGS. 6 and 7, an embodiment of a device manufacturing method which uses an exposure apparatus described above, will be explained.

Figure 6:
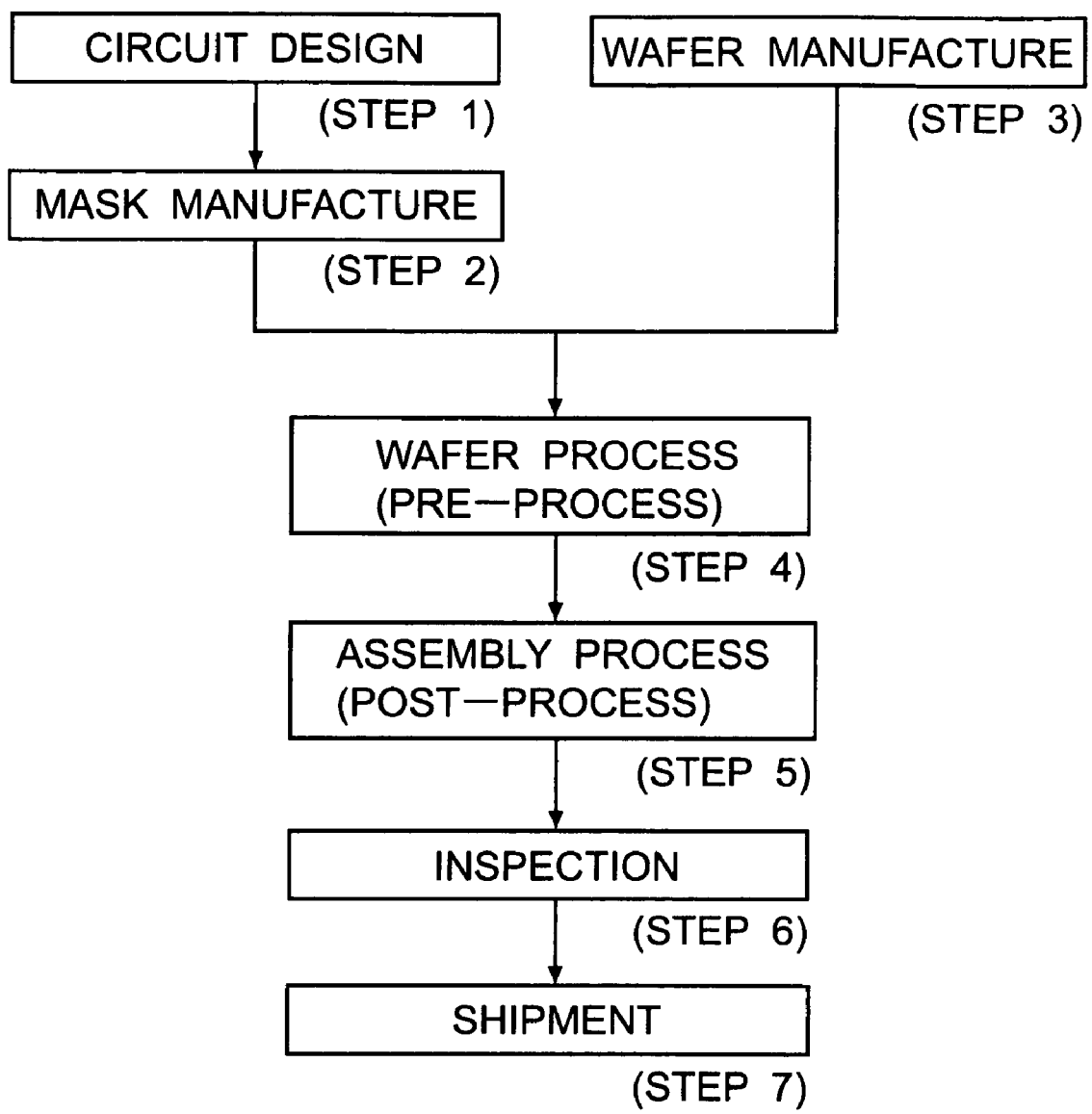
FIG. 6 is a flow chart of sequences of semiconductor device manufacturing procedure.

FIG. 6 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 7:
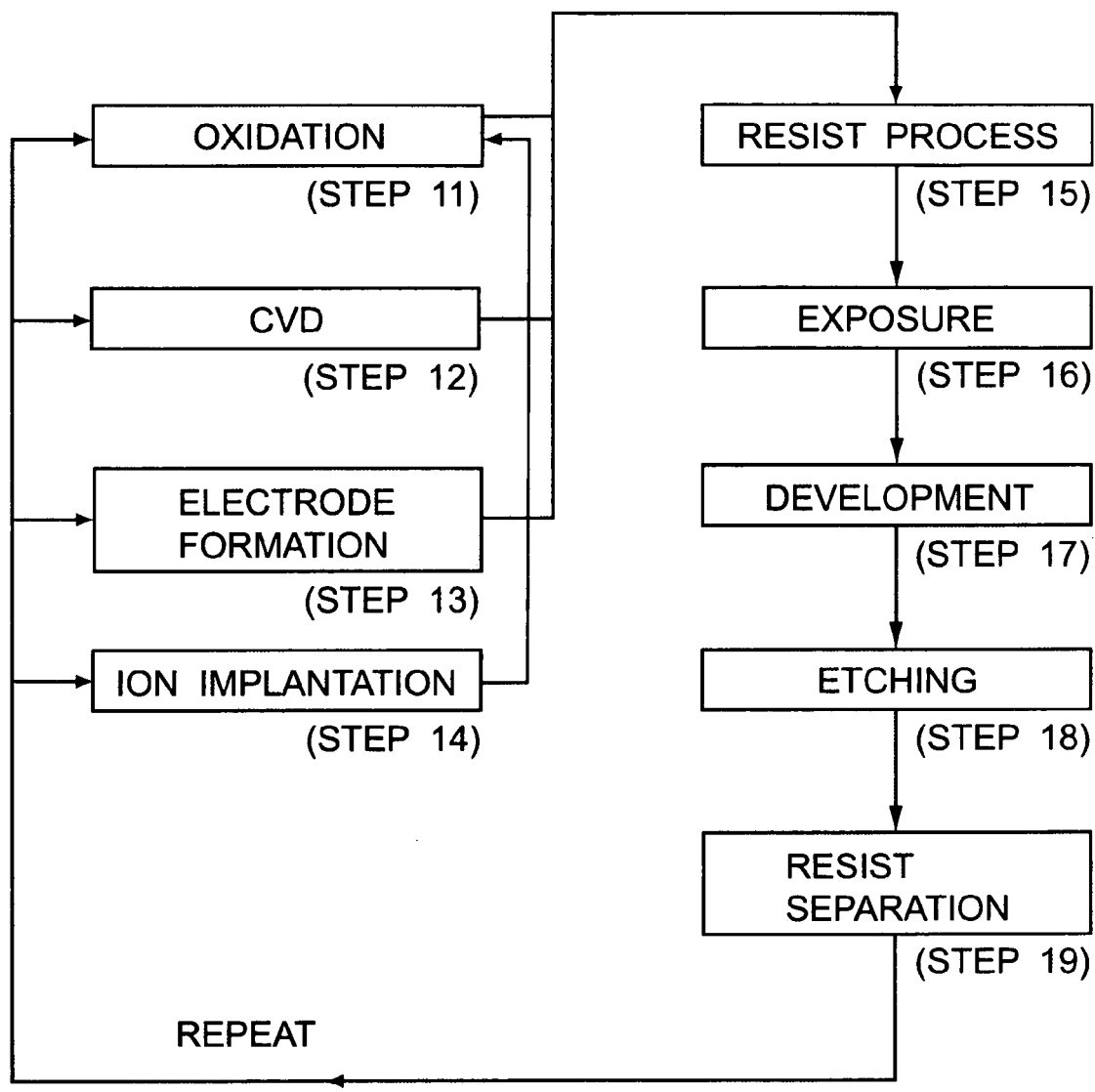
FIG. 7 is a flow chart for explaining details of a wafer process in the procedure of FIG. 6.

FIG. 7 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-333627 filed Sep. 25, 2003, for which is hereby incorporated by reference.

What is claimed is:

1. An illumination system for illuminating a surface to be illuminated, with light from a light source, said illumination system comprising:

a first optical integrator having a first cylindrical lens group, a second cylindrical lens group, a third cylindrical lens group and a fourth cylindrical lens group, for forming a plurality of first secondary light sources by use of light from the light source, wherein said first to fourth cylindrical lens groups are disposed along an optical axis direction of said illumination system;

a second optical integrator for forming a second secondary light source by use of light from the first secondary light sources;

a first collecting optical system for superposing light from the first secondary light sources on a light entrance surface of said second optical integrator;

a second collecting optical system for superposing light from the second secondary light source on the surface to be illuminated; and a driving mechanism for decentering at least one of said first to fourth lens groups in a light path of said illumination system along a plane perpendicular to the optical axis, to shift an illumination range upon the light entrance surface of said second optical integrator thereby to adjust telecentricity of light illuminating the surface to be illuminated;

wherein said first and third cylindrical lens groups have a refractive power with respect to a first direction being perpendicular to the optical axis, while said second and fourth cylindrical lens groups have a refractive power with respect to a second direction being perpendicular to the first direction; and wherein, when the illumination range is to be shifted in the first direction, said driving mechanism decenters one of said first and third cylindrical lens groups, and wherein, when the illumination range is to be shifted in the second direction, said driving mechanism decenters one of said second and fourth cylindrical lens groups.

2. An illumination system according to claim 1, wherein said first collecting optical system comprises a condenser for superposing light from the first secondary light sources on a predetermined plane, and an imaging optical system for imaging light from the predetermined plane on the light entrance surface of said second optical integrator at a desired magnification.

3. An illumination system according to claim 1, further comprising a detector for detecting telecentricity of light illuminating the surface to be illuminated or a surface being conjugate with the surface to be illuminated, wherein said driving mechanism moves at least one lens group on the basis of the detection made by said detector.

4. An illumination system according to claim 1, further comprising a memory for storing therein a drive amount for moving the at least one lens group with respect to each of different illumination modes effective to illuminate the surface to be illuminated under different illumination conditions, wherein, when one illumination mode is changed to another, the at least one lens group is driven in accordance with information stored in said memory.

5. An exposure apparatus, comprising:

an illumination system as recited in claim 1, for illuminating a reticle; and a projection system for projecting a pattern of the reticle onto a substrate.

6. A device manufacturing method, comprising the steps of:

exposing a substrate by use of an exposure apparatus as recited in claim 5; and developing the exposed substrate.

7. An illumination system according to claim 1, further comprising a detector for detecting telecentricity of light that illuminates said surface to be illuminated or a surface being conjugate with it, and a memory for storing adjusted positions of at least one of said first to fourth lens groups, which positions are associated with different illumination modes, respectively, for illuminating said surface to be illuminated, under different illumination conditions, wherein the adjusted positions are determined on the basis of the detection made by said detector, and wherein, when an illumination mode is changed by another, said driving mechanism drives at least one of said first to fourth lens groups on the basis of positional information stored in said memory.

* * * * *